US008432467B2

(12) United States Patent
Jaworski et al.

(10) Patent No.: US 8,432,467 B2
(45) Date of Patent: Apr. 30, 2013

(54) INTEGRATED DETECTION AND DISPLAY IMAGING SYSTEM AND METHOD

(75) Inventors: Frank B. Jaworski, Goleta, CA (US); Christopher Fletcher, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 423 days.

(21) Appl. No.: 12/509,335

(22) Filed: Jul. 24, 2009

(65) Prior Publication Data
US 2011/0019055 A1 Jan. 27, 2011

(51) Int. Cl.
*H04N 3/14* (2006.01)
*H04N 5/335* (2011.01)

(52) U.S. Cl.
USPC ...................... 348/294; 348/333.01

(58) Field of Classification Search ........... 348/294, 348/333.01, 373, 374, 375; 345/104; 349/116
See application file for complete search history.

(56) References Cited

U.S. PATENT DOCUMENTS

| | | | | |
|---|---|---|---|---|
| 5,076,670 A * | 12/1991 | Sayyah | .......................... | 349/27 |
| 5,081,542 A * | 1/1992 | Efron et al. | ..................... | 349/11 |
| 5,227,886 A * | 7/1993 | Efron et al. | ..................... | 348/62 |
| 5,340,978 A * | 8/1994 | Rostoker et al. | ........... | 250/208.1 |
| 5,389,788 A * | 2/1995 | Grinberg et al. | ............. | 250/331 |
| 5,432,333 A * | 7/1995 | Rostoker et al. | ........... | 250/208.1 |
| 5,519,205 A * | 5/1996 | Rostoker | ..................... | 250/208.1 |
| 5,528,392 A * | 6/1996 | Nakagawa et al. | ................ | 349/5 |
| 5,648,655 A * | 7/1997 | Rostoker | ..................... | 250/208.1 |
| 5,734,155 A * | 3/1998 | Rostoker | ..................... | 250/208.1 |
| 5,760,834 A * | 6/1998 | Rostoker | ........................ | 348/340 |
| 5,846,850 A * | 12/1998 | Dreiske et al. | .................. | 438/67 |
| 5,920,401 A * | 7/1999 | Street et al. | ..................... | 358/400 |
| 5,929,845 A * | 7/1999 | Wei et al. | ....................... | 345/156 |
| 5,977,535 A * | 11/1999 | Rostoker | ..................... | 250/208.1 |
| 6,106,245 A * | 8/2000 | Cabuz | ............................ | 417/322 |
| 6,154,254 A * | 11/2000 | Hawkins et al. | ............... | 348/374 |
| 7,180,546 B2 * | 2/2007 | Kobayashi | ..................... | 348/374 |
| 7,324,748 B2 * | 1/2008 | Abe et al. | ......................... | 396/55 |
| 7,341,938 B2 | 3/2008 | Enquist | | |
| 7,383,019 B1 * | 6/2008 | Thorsted et al. | ............. | 455/11.1 |

(Continued)

OTHER PUBLICATIONS

Efron et al, A CMOS-Liquid Crystal-Based Image Transceiver Device, SPIE, vol. 4306, published 2001.*

(Continued)

*Primary Examiner* — Nicholas Giles
(74) *Attorney, Agent, or Firm* — Christie, Parker & Hale, LLP

(57) ABSTRACT

An imaging system for receiving data from a scene and displaying an image therefrom includes a detector and a display. The detector includes a plurality of detector pixels on a first side of the detector, readout circuitry on an opposing second side of the detector or between the detector and the detector pixels on the first side of the detector, and a plurality of detector vias configured to provide electrical connectivity for the plurality of detector pixels through the detector. The display includes a plurality of display pixels on one side of the display, read in circuitry on an opposing second side of the display or between the display and the display pixels on the first side of the display, and a plurality of display vias configured to provide electrical connectivity for the plurality of display pixels through the display. The read in circuitry is coupled with the readout circuitry.

19 Claims, 5 Drawing Sheets

LEGEND
Detector - 502
Quantum Dot Detectors - 504
Detector Pixel Defining Pads - 506
Filler Layer - 508
Readout Circuit Die - 510
Detector Vias - 512
Conductive Material - 514
Insulating Material - 516
Readout Circuit - 518
Read In Circuitry - 520
Read In Circuit Die - 522
Display Vias - 524
Display Pixel Defining Pads - 526
Display - 528
Organic Light Emitting Diodes - 530

U.S. PATENT DOCUMENTS

| | | | |
|---|---|---|---|
| 7,397,368 B2* | 7/2008 | Otto et al. | 340/539.22 |
| 7,616,877 B2* | 11/2009 | Zarnowski et al. | 396/85 |
| 7,663,693 B2* | 2/2010 | Sun et al. | 348/374 |
| 7,767,949 B2* | 8/2010 | Perlman et al. | 250/208.1 |
| 7,863,813 B2* | 1/2011 | Park et al. | 313/506 |
| 8,029,139 B2* | 10/2011 | Ellinger et al. | 353/7 |
| 2006/0045504 A1 | 3/2006 | Zarnowski et al. | 396/79 |
| 2006/0056839 A1 | 3/2006 | Abe et al. | 396/452 |
| 2006/0157640 A1* | 7/2006 | Perlman et al. | 250/208.1 |
| 2006/0238523 A1* | 10/2006 | Hunt et al. | 345/204 |
| 2007/0047936 A1* | 3/2007 | Hirota | 396/55 |
| 2008/0001069 A1* | 1/2008 | Perlman et al. | 250/208.1 |
| 2008/0165267 A1* | 7/2008 | Cok | 348/333.01 |
| 2009/0152664 A1* | 6/2009 | Klem et al. | 257/440 |
| 2009/0290680 A1* | 11/2009 | Tumer et al. | 378/62 |
| 2010/0116999 A1* | 5/2010 | Tumer et al. | 250/370.13 |
| 2010/0187408 A1* | 7/2010 | Klem et al. | 250/214.1 |

OTHER PUBLICATIONS

Efron et al, CMOS/LCOS—Based Image Transceiver Device, SPIE, vol. 4457, published 2001.*

Efron et al, The Charged-Coupled-Device-Addressed Liquid Crystal Light Valve, An Update, SPIE, vol. 1455, published 1991.*

Japan Office action from corresponding Japan application No. 2010-165427, Office action mailed May 8, 2012 (3 pages).

English language translation of Japan Office action from corresponding Japan application No. 2010-165427, Office action mailed May 8, 2012 (4 pages).

* cited by examiner

LEGEND
Imaging Optics - 102
Detector - 104
Organic Biological Threat Film - 106
Organic Chemical Threat Film - 108
Readout Circuit - 110
Display - 112
Magnifier - 114

LEGEND
Imaging Optics - 202
Detector - 204
Organic Biological Threat Film - 206
Organic Chemical Threat Film - 208
Readout Circuit - 210
Correction Circuit - 212
Display Driver - 214
Display - 216
Magnifier - 218

LEGEND

Detector - 502
Quantum Dot Detectors - 504
Detector Pixel Defining Pads - 506
Filler Layer - 508
Readout Circuit Die - 510
Detector Vias - 512
Conductive Material - 514
Insulating Material - 516
Readout Circuit - 518
Read In Circuitry - 520
Read In Circuit Die - 522
Display Vias - 524
Display Pixel Defining Pads - 526
Display - 528
Organic Light Emitting Diodes - 530

INTEGRATED DETECTION AND DISPLAY IMAGING SYSTEM AND METHOD

BACKGROUND OF THE INVENTION

1. Field of the Invention

The present invention relates to an imaging system integrating a detector and a display therein, and method thereof.

2. Description of Related Art

Detectors and displays have been widely used in numerous applications to obtain imagery from a scene and display either the imagery or other relevant data to an observer.

Various stand-alone detectors have been developed to detect radiation and/or energy in the visual and/or infrared wavebands. In addition, various stand-alone displays have been developed to display any and all relevant data to an observer.

In some applications, it is advantageous to combine a detector and a display to create an imaging system. Imaging systems generally require readout and processing circuitry to convert analog signals into digital signals. Imaging systems also generally require processing and driver circuitry to convert the digital signals into a signal or set of signals suitable to drive the display. Due to the nature of detectors, having a plurality of pixels to detect imagery, and due to the nature of displays, having a plurality of pixels to display imagery, conventional systems multiplex the signals transferred from the detector to a processor and/or correction circuitry for processing and demultiplex the processed signals to the display and/or display driver. Multiplexing circuitry may include column amplifiers, sample and hold circuitry, output drivers and clocking circuitry. Demultiplexer circuitry may include similar circuitry. In addition, conventional systems require electronics and cables external to the detector and display to provide the functionality of these various circuits. Accordingly, a conventional imaging system generally requires a detector package, a display package, external processing/amplification circuitry and cables and interconnections between the detector package and the external processing/amplification circuitry. In addition, the detector package may be required to perform driving and correction of gain and DC offset functions.

The resulting conventional imaging system is relatively large and may not be suitable for applications where size, weight, power, cost and/or complexity of the system must be minimal.

SUMMARY OF THE INVENTION

Exemplary embodiments according to the present invention provide an integrate detect and display system and method thereof. The method and system herein directly integrates a detector with a display such that multiplexing and demultiplexing to off-chip processors is not necessary, resulting in a reduction of weight, size, cost and power consumption.

According to an embodiment in accordance with the present invention, there is presented an imaging system for receiving data from a scene and displaying an image therefrom. The imaging system includes a detector and a display. The detector includes a plurality of detector pixels on a first side of the detector, readout circuitry on an opposing second side of the detector or between the detector and the detector pixels on the first side of the detector, and a plurality of detector vias configured to provide electrical connectivity for the plurality of detector pixels through the detector. The display includes a plurality of display pixels on one side of the display, read in circuitry on an opposing second side of the display or between the display and the display pixels on the first side of the display, and a plurality of display vias configured to provide electrical connectivity for the plurality of display pixels through the display. The read in circuitry is coupled with the readout circuitry.

The imaging system may further include a correction circuit configured to control gain and offset and coupled between the detector and the display.

The imaging system may further include a display driver configured to drive the signal to be displayed and coupled between the detector and the display.

According to another embodiment in accordance with the present invention, there is presented a method of detecting data from a scene and displaying an image therefrom. First, data from the scene is received utilizing a detector. The data is converted into a corresponding signal. The signal is read out from the detector utilizing readout circuitry oriented behind and substantially coextensive with the detector. The signal is read in from the readout circuitry to a display utilizing read in circuitry oriented behind and substantially coextensive with the readout circuitry. The image is displayed in accordance with the signal utilizing a display oriented behind and substantially coextensive with the read in circuitry.

According to yet another embodiment in accordance with the present invention, there is presented a vertically integrated stack of die configured to provide mechanical and electrical connectivity through each of the die therein. The vertically integrated stack of die includes a detector die. The detector die includes a plurality of detector pixels and a plurality of detector vias configured to provide electrical connectivity for the detector pixels through the detector die. The vertically integrated stack of die further includes a display die. The display die includes a plurality of display pixels on a first side of the display die, display driver circuitry on an opposing second side of the display die, and a plurality of display vias configured to provide electrical connectivity for the display pixels through the display die. The vertically integrated stack of die further includes a readout circuit die coupled between and substantially coextensive with the detector die and the display die. The readout circuit die includes readout circuitry configured to read out detector data from the detector die and a plurality of readout vias configured to provide electrical connectivity for the readout circuitry through the readout circuit die. The readout circuitry of the readout circuit die is coupled with the display driver circuitry of the display die.

According to another embodiment in accordance with the present invention, there is presented an imaging system for receiving data from a scene and displaying an image therefrom. The imaging system includes a readout circuit and a read in circuit. The readout circuit includes a plurality of detector pixels on a first side of the readout circuit, readout circuitry on an opposing second side of the readout circuit or between the detector pixels and the readout circuit on the first side of the readout circuit, and a plurality of detector vias configured to provide electrical connectivity for the detector pixels through the readout circuit. The read in circuit includes a plurality of display pixels on a first side of the read in circuit, read in circuitry on an opposing second side of the read in circuit or between the display pixels and the read in circuit on the first side of the read in circuit, and a plurality of display vias configured to provide electrical connectivity for the display pixels through the read in circuit. The read in circuitry of the read in circuit is coupled with the readout circuitry of the readout circuit.

The detector pixels may be defined by a plurality of detector pixel defining pads, each of the detector pixel defining pads coupled with one of the detector vias. The display pixels may be defined by a plurality of display pixel defining pads, each of the display pixel defining pads coupled with one of the display vias.

BRIEF DESCRIPTION OF THE DRAWINGS

The accompanying drawings, together with the specification, illustrate exemplary embodiments of the present invention, and, together with the description, serve to explain the principles of the present invention, wherein.

DETAILED DESCRIPTION OF THE INVENTION

Figure 1:
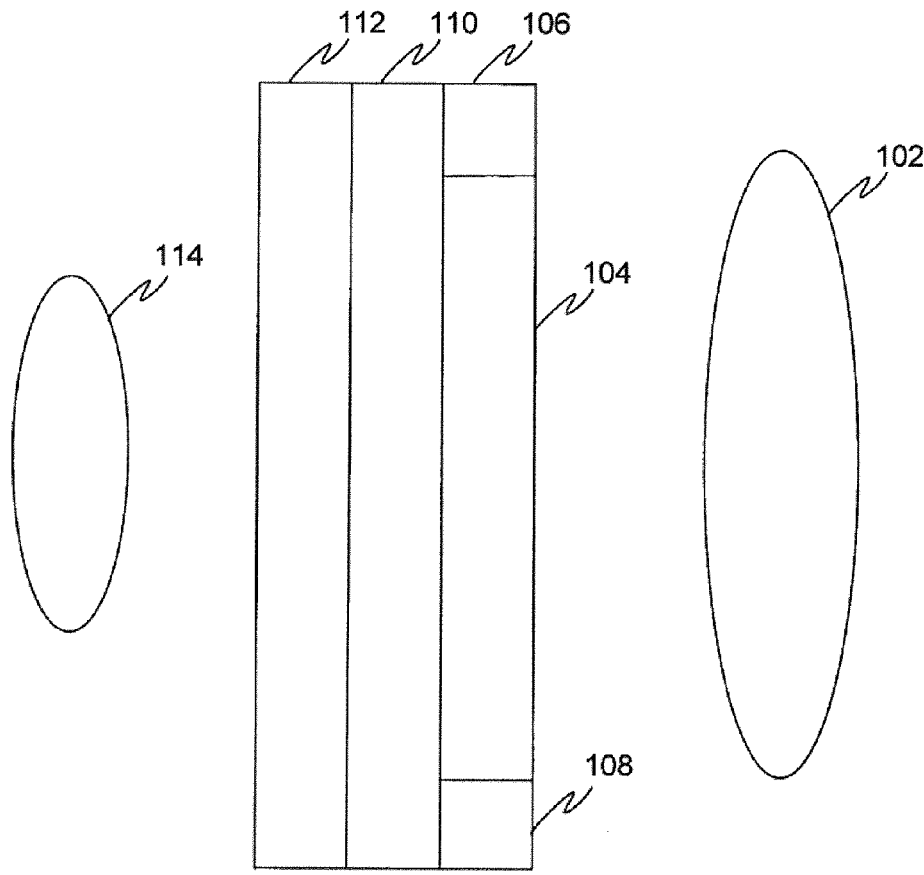
FIG. 1 is a schematic block diagram of an integrate detect and display system in accordance with an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Accordingly, there is presented an integrate detect and display system in accordance with embodiments of the present invention. In an exemplary embodiment, the direct vertical integration of a detector and a display is achieved, thereby rendering multiplexing and demultiplexing to and from off-chip processors unnecessary. Therefore, there is provided an integrate detect and display system in accordance with embodiments of the present invention with reduced weight, size, cost and power consumption. In accordance with the present invention, detector pixels and display pixels are arranged in vertically integrated columns to form pixel-to-pixel pairs with dedicated circuit portions therebetween. The dedicated circuit portions located between and substantially in-line with one detector pixel/display pixel pair are physically separate, and electrically independent, from the circuit portions located between adjacent pixel-to-pixel pairs. Accordingly, as used herein, the term "direct vertical integration" refers to both the direct geometric alignment of a display pixel behind a corresponding detector pixel, and the direct vertical flow of scene information from the detector pixel to the corresponding display pixel through the dedicated circuit portions located between and substantially in-line with the detector pixel/display pixel pair. For instance, in the embodiment illustrated in FIG. 5, each detector pixel defining pad 506 is vertically connected to a dedicated readout circuit portion 518 and dedicated read in circuit portion 520 by means of a dedicated detector via 512, and the readout circuit portion 520 is vertically connected to a corresponding display pixel 526 by means of a dedicated display via 524. Accordingly, this disclosed embodiment achieves both geometric vertical integration of each display pixel behind a corresponding detector pixel and direct vertical flow of scene info illation from each detector pixel to each corresponding display pixel.

Referring to FIGS. 1-5, various embodiments of the detector and display are implemented. For example, the detector and the display are thin films on one side of a readout or read in circuit die. In other embodiments, the detector includes a detector die and the display includes a display die. The detector die may include readout circuitry, in which case the readout circuit die is unnecessary, and the display die may include read in circuitry, in which case the read in circuit die is unnecessary. Other arrangements, many of which are described herein, may be implemented in an integrate detect and display system and method in accordance with embodiments of the present invention.

FIG. 1 is a block diagram of an integrate detect and display system in accordance with an embodiment of the present invention.

Referring to FIG. 1, an integrate detect and display system 100 includes imaging optics 102, a detector 104, an organic biological threat film 106, an organic chemical threat film 108, a readout circuit 110, a display 112, and a magnifier 114. One or more of the above-referenced elements may be located on die (e.g., semiconductor substrates, chips, wafers, etc.) and bonded and/or electrically coupled to form a vertically integrated stack of die.

The imaging optics 102 optically processes radiation and/or energy from a scene. For example, the imaging optics 102 is any type of optical system configured to obtain radiation or other types of energy at various wavelengths. The imaging optics 102 may include an infrared sensor configured to obtain infrared radiation upwelling from a scene. One of ordinary skill in the art would recognize that the system parameters and desired application of the imaging system 100 dictate the type of imaging optics to be utilized.

The detector 104 receives radiation and converts the radiation into a signal. For example, the detector 104 is an array of quantum dot detectors arranged as a focal plane array. In other embodiments, the detector 104 includes an array of organic light emitting diodes arranged as a focal plane array or any other array of detectors sensitive to a desired bandwidth of radiation. In an embodiment, the quantum dot detectors have a 20-micron pitch and sense energy corresponding to wavelengths between about 0.4 $\mu m$ and 1.9 $\mu m$. One of ordinary skill in the art would recognize that system design considerations dictate the desired bandwidth of radiation and accordingly, the materials and components thereof.

Referring still to the detector 104, the detector 104 includes a plurality of detector pixels on a first side of the detector, and a plurality of detector vias configured to provide electrical connectivity for the detector pixels through the detector 104. For example, the detector 104 includes a detector die (e.g., a semiconductor substrate, chip, wafer, etc.).

The organic biological threat film 106 is configured to sense biological agents at a sensor and provide a signal corresponding to the detected biological agent. For example, the organic biological threat film 106 senses biological agents such as bacterial spores. While the organic biological threat film 106 is depicted in FIG. 1 as being separate from the detector 104, in an embodiment, the organic biological threat film 106 is integrated with the detector 104.

The organic chemical threat film 108 is configured to sense chemical agents at a sensor and provide a signal corresponding to the detected chemical agent. For example, the organic chemical threat film 108 senses chemical agents that may provide useful analytic data or detect harmful chemical agents in an environment. While the organic chemical threat film 108 is depicted in FIG. 1 as being separate from the detector 104, in an embodiment, the organic chemical threat film 108 is integrated with the detector 104.

The readout circuit 110 receives signals from the detector 104, the organic biological threat film 106 and the organic chemical threat film 108. For example, the readout circuit 110 is a die (e.g., a semiconductor substrate, chip, wafer, etc.). Accordingly, the vertically integrated stack of die includes a detector die, a readout circuit die and a display die. In the described embodiment of FIG. 1, the readout circuit 110 includes readout circuitry on a side facing the detector 104 or an opposing side facing the display 112. If the readout circuitry is located on the side facing the detector 104, the readout circuit 110 may also include read in circuitry on the opposing side facing the display 112.

Alternatively, in another embodiment, the readout circuitry is located on the opposing side of the readout circuit 110 facing the display 112 and the display 112 includes read in circuitry. In yet another embodiment, the detector 104 includes readout circuitry either on the first side of the detector or on an opposing second side of the detector 104. In this embodiment, the readout circuit 110 is not present since the readout circuitry is integrated with the detector 104.

For example, the readout circuitry is formed from Complementary Metal-Oxide-Semiconductor (CMOS) layers on either side of the readout circuit 110 to form a CMOS integrated circuit.

Referring still to FIG. 1, in an embodiment, read in circuitry is located on either side of a read in circuit (e.g., a read in circuit die).

The display 112 is configured to receive signals and display an image on the display 112 corresponding to the signals. For example, the display 112 is any type of display including an array of display pixels arranged as an array suitable to display an image. One of ordinary skill in the art would understand that the type of display is chosen depending on the system requirements and overall design characteristics. For example, an array of quantum dots is suitable for systems requiring a compact apparatus due to the relatively small size of the quantum dots. In the embodiment in accordance with the present invention depicted in FIG. 1, the vertically integrated stack of die includes a detector die, a readout circuit die and a display die. In this case, the readout circuit may include the readout circuitry and the read in circuitry. Alternatively, the readout circuit may include the readout circuitry and the display includes the read in circuitry.

When the imaging system 100 includes a read in circuit die, the vertically integrated stack of die includes a detector die, a readout circuit die (assuming that the readout circuitry is not implemented on the detector die), a read in circuit die, and a display die. In yet another embodiment, the read in circuitry may include display driver circuitry.

The magnifier 114 magnifies the image displayed by the display 112 to a size suitable for viewing by the human eye. For example, the integrate detect and display system is mounted on a soldier's helmet. In this case, the magnifier 114 magnifies the image displayed by the display 112 from a very short distance (e.g., a few centimeters). The integrate detect and display system may also be mounted such that the magnifier 114 magnifies the image displayed by the display 112 from an even shorter distance (e.g., less than a centimeter). One of ordinary skill in the art would recognize that various configurations of the magnifier 114 are possible depending on the design choices and characteristics of the system.

Figure 2:
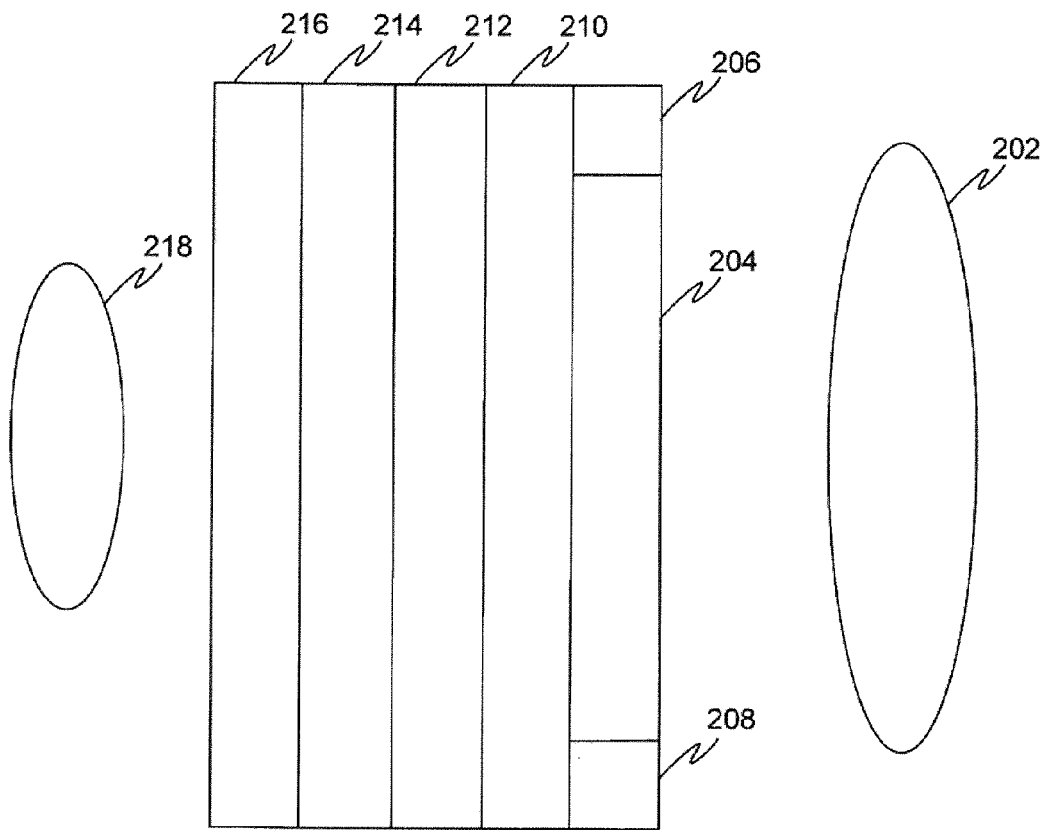
FIG. 2 is a schematic block diagram of an integrate detect and display system in accordance with another embodiment of the present invention.

FIG. 2 is a block diagram illustrating an integrate detect and display system in accordance with another embodiment of the present invention.

Referring to FIG. 2, an integrate detect and display system 200 includes imaging optics 202, a detector 204, an organic biological threat film 206, an organic chemical threat film 208, a readout circuit 210, a correction circuit 212, a display driver 214, a display 216, and a magnifier 218. One or more of the above-referenced elements may be located on die (e.g., a semiconductor substrate, chip, wafer, etc.) and bonded (e.g., mechanically coupled) and electrically coupled to form a vertically integrated stack of die.

The imaging optics 202 optically processes radiation and/or energy from a scene. For example, the imaging optics 202 is any type of optical system for obtaining radiation or other types of energy at various wavelengths. The imaging optics 202 may include an infrared sensor for obtaining infrared radiation upwelling from a scene. One of ordinary skill in the art would recognize that the system parameters and desired application of the imaging system 200 dictate the type of imaging optics to be utilized.

The detector 204 receives radiation and converts the radiation into a signal. For example, the detector 204 is any suitable type of detector. The detector 204 may be an array of quantum dot detectors arranged as a focal plane array. In other embodiments, the detector 204 includes an array of organic light emitting diodes arranged as a focal plane array or any other array of detectors sensitive to a desired bandwidth of radiation. In an embodiment, the quantum dot detectors have a 20-micron pitch and sense energy corresponding to wavelengths between about 0.4 $\mu$m and 1.9 $\mu$m. One of ordinary skill in the art would recognize that system design considerations dictate the desired bandwidth of radiation and accordingly, the materials and components used for the detector 104.

Referring still to the detector 204, the detector 204 includes a plurality of detector pixels on a first side of the detector, and a plurality of detector vias to provide electrical connectivity for the detector pixels through the detector 204. For example, the detector 204 is a die (e.g., a semiconductor substrate, chip, wafer, etc.).

The organic biological threat film 206 senses biological agents at a sensor and provides a signal corresponding to the detected biological agent. For example, the organic biological threat film 206 senses biological agents such as bacterial spores. While the organic biological threat film 206 is depicted in FIG. 2 as being separate from the detector 204, in an embodiment, the organic biological threat film 106 is integrated with the detector 204.

The organic chemical threat film 208 senses chemical agents at a sensor and provides a signal corresponding to the detected chemical agent. For example, the organic chemical threat film 208 senses chemical agents that may provide useful analytic data or detect harmful chemical agents in an environment. While the organic chemical threat film 208 is depicted in FIG. 2 as being separate from the detector 204, in an embodiment, the organic chemical threat film 208 is integrated with the detector 204.

The readout circuit 210 reads out signals from the detector 204, the organic biological threat film 206 and the organic chemical threat film 108. For example, the readout circuit 210 is a die (e.g., a semiconductor substrate, chip, wafer, etc.). In the embodiment in accordance with FIG. 2, the readout circuit 210 includes readout circuitry on a side facing the detector 204 or an opposing side facing the display 216. The readout circuit 210 may also include read in circuitry on the opposing side facing the display 216.

In another embodiment, the readout circuitry is located on the opposing side of the readout circuit 210 facing the display 216 and the display 216 includes the read in circuitry. In this and other embodiments, the readout circuitry is formed from CMOS layers on either side of the readout circuit 210 to form a CMOS integrated circuit.

Referring still to FIG. 2, in an embodiment, read in circuitry is located on either side of a read in circuit (e.g., a read in circuit die). In an embodiment, the detector 204 includes readout circuitry either on the first side of the detector 204 or on an opposing second side of the detector 204. In this embodiment, the readout circuit 210 is not present since the readout circuitry is integrated with the detector 204.

The correction circuit 212 is configured to control gain and offset of the read out signals read out of the readout circuitry. For example, the signals output by the detector 204 and read out to the correction circuit 212 by the readout circuit 210 are relatively low in magnitude (e.g., picoamps), and must be amplified by the correction circuit 212 to a higher magnitude (e.g., milliamps) to be suitable for display on the display 216. In addition, the correction circuit 212 may apply an offset to the signals read out of the detector 204 to correct for a generated DC offset. In an embodiment, the correction circuit 212 is a die (e.g., a semiconductor substrate, chip, wafer, etc.). Therefore, the correction circuit 212 includes a plurality of vias configured to provide electrical connectivity from one side of the die to an opposing side of the die. Accordingly, the correction circuit die is coupled to the readout circuitry on one side and the read in circuitry on the other side.

In another embodiment, the other die (e.g., the detector die, the readout circuit die, the read in circuit die, the display die) may control gain and offset of the read out signals. In this case, the correction circuit 212 is not necessary. However, one of ordinary skill in the art would recognize when a separate correction circuit die is advantageous based on system design principles.

The display driver 214 generates and transmits driving signals to the display 216. For example, an array of organic light emitting diodes may be driven using conventional driving waveforms. One of ordinary skill in the art would understand that the type of display 216 dictates the possible methods of driving the display 216.

The display 216 receives driving signals and displays an image on the display 112 corresponding to the driving signals. For example, the detector 212 is any type of display including an array of display pixels arranged as an array suitable to display an image. One of ordinary skill in the art would understand that the type of display is chosen depending on the system requirements and overall design characteristics. For example, an array of quantum dots is suitable for systems requiring a compact apparatus due to the relatively small size of the quantum dots. In the embodiment in accordance with FIG. 2, the vertically integrated stack of die includes a detector die, a readout circuit die and a display die. In this case, the readout circuit may include the readout circuitry and the read in circuitry. Alternatively, the readout circuit 210 may include the readout circuitry and the display 216 includes the read in circuitry.

The imaging system 200 identifies a vertically integrated stack of die including a detector die, a readout circuit die, a correction circuit die, a display driver die and a display die.

The magnifier 218 magnifies the image displayed by the display 112 to a size suitable for viewing by the human eye. For example, the integrate detect and display system is mounted on a soldier's helmet. In this case, the magnifier 218 magnifies the image displayed by the display 216 from a very short distance (e.g., a few centimeters). The integrate detect and display system may also be mounted such that the magnifier 218 magnifies the image displayed by the display 112 from an even shorter distance (e.g., less than a centimeter). One of ordinary skill in the art would recognize that various configurations of the magnifier 114 are possible depending on the design choices and characteristics of the system.

Figure 3:
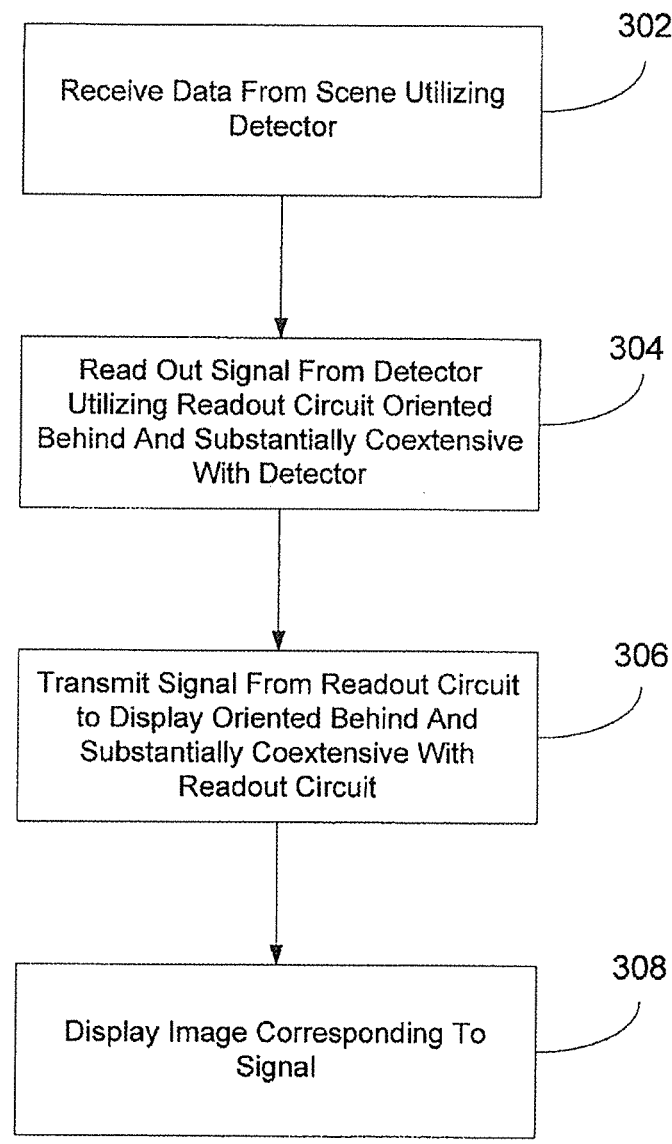
FIG. 3 is a flow diagram of a method of detecting data from a scene and displaying an image therefrom in accordance with an embodiment of the present invention.

FIG. 3 is a flow diagram illustrating a method of detecting data from a scene and displaying an image therefrom in accordance with an embodiment of the present invention.

Referring now to FIG. 3, at Block 302, data is received from the scene utilizing a detector. The received data is converted into a corresponding signal. For example, the signal may have power amplitude of picoamps. The detector includes a plurality of detector pixels on a first side of the detector and a plurality of detector vias to provide electrical connectivity for the plurality of detector pixels through the detector. In addition, the detector may include an organic biological threat film and/or an organic chemical threat film.

At Block 304, the signal is read out from the detector utilizing readout circuitry. For example, the readout circuitry is oriented behind and substantially coextensive with the detector. The readout circuitry may be integrated with the detector (e.g., detector 104, 204) or included independently on a readout circuit (e.g., readout circuit 110, 210). For example, the detector includes a detector die having a plurality of detector vias that electrically couple the detector pixels on the first side of the detector with the other side of the detector. If the readout circuitry is integrated with the detector, the detector vias provide electrical connectivity between the detector pixels on the first side of the detector and the readout circuitry on the other side of the detector.

At Block 306, the signal is read in to a display utilizing read in circuitry. The read in circuitry receives the signal from the readout circuitry. For example, the read in circuitry is oriented behind and substantially coextensive with the readout circuitry. The read in circuitry may be electrically and mechanically coupled with the read out circuitry (e.g., FIG. 5). Alternatively, the read in circuitry is located on either side of a read in circuit die, and is electrically coupled to the readout circuitry and the display. If the read in circuitry is located on a side of the read in circuit die facing the display, the read in circuitry is electrically coupled to the readout circuitry through the plurality of vias. The plurality of vias of the read in circuit die provide electrical connectivity between the side of the read in circuit die facing the display and an opposing side of the read in circuit die facing the readout circuitry.

At Block 308, the image is displayed. The image corresponds to the signal transmitted from the read in circuitry. The image, for example, includes text, provides an image of a distant scene, and incorporates warning signals such as colors, etc., to signify biological or chemical threats. One of ordinary skill would understand that the content of the image is dictated by the overall system design and requirements.

Figure 4:
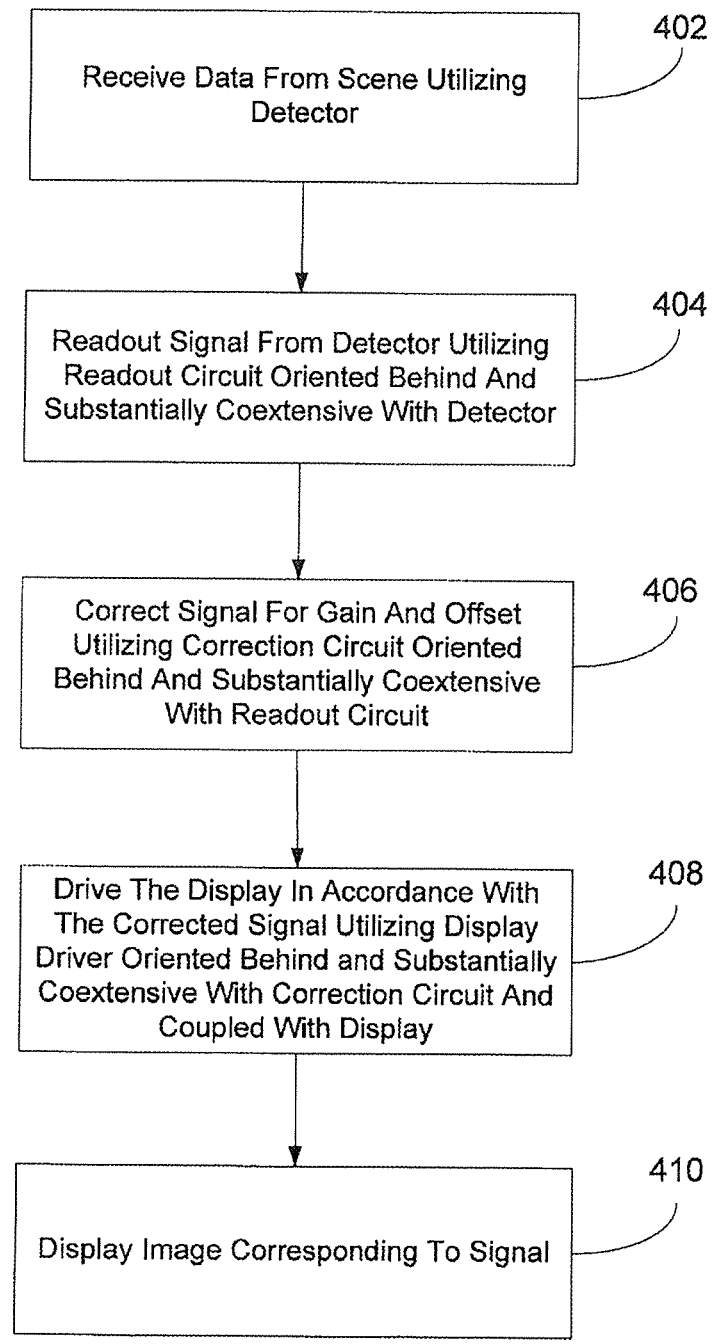
FIG. 4 is a flow diagram of a method of detecting data from a scene and displaying an image therefrom in accordance with another embodiment of the present invention.

FIG. 4 is a flow diagram illustrating a method of detecting data from a scene and displaying an image therefrom in accordance with another embodiment of the present invention.

Referring now to FIG. 4, at Block 402, data is received from the scene utilizing a detector. The received data is converted into a corresponding signal. For example, the signal may have power amplitude of picoamps. The detector includes a plurality of detector pixels on a first side of the detector and a plurality of detector vias configured to provide electrical connectivity for the plurality of detector pixels through the detector. For example, the detector includes a detector die having the plurality of detector vias that electrically connect the detector pixels on the first side of the detector with the other side of the detector. In addition, the detector may include an organic biological threat film and/or an organic chemical threat film.

At Block 404, the signal is read out from the detector utilizing readout circuitry. For example, the readout circuitry is oriented behind and substantially coextensive with the detector. The readout circuitry may be integrated with the detector (e.g., detector 104, 204) or included independently on a readout circuit (e.g., readout circuit 110, 210). If the readout circuitry is integrated with the detector, the detector vias provide electrical connectivity between the detector pixels on the first side of the detector and the readout circuitry on the other side of the detector. When the readout circuitry is integrated with the readout circuit, the readout circuit is oriented behind and substantially coextensive with the detector, and a plurality of vias provide electrical connectivity between one side of the readout circuit and an opposing second side of the readout circuit. For example, the readout circuit includes a readout circuit die.

At Block 406, the signal is corrected for gain and offset utilizing correction circuitry. For example, the correction circuitry is oriented behind and substantially coextensive with the readout circuit. The correction circuitry may be located on one or both sides of a correction circuit die. Similarly to the other die, if the correction circuitry is on a side of the correction circuit die facing the readout circuit, an opposing side of the correction circuit die facing the display includes contacts to electrically couple the display to the correction circuitry through the correction circuit die with a plurality of vias. The plurality of vias of the correction circuit die is configured to provide electrical connectivity between the side facing the readout circuit and the opposing side facing the display.

At Block 408, the display is driven in accordance with the corrected signal. The display may be driven utilizing display driver circuitry oriented behind and substantially coextensive with the correction circuitry. For example, the display driver circuitry is located on a display driver die having a plurality of vias configured to provide electrical connectivity between the correction circuitry and the display. The display driver die may also include read in circuitry located on a side facing the correction circuitry. The read in circuitry receives the signal from the correction circuitry. For example, the read in circuitry is oriented behind and substantially coextensive with the correction circuitry. As with other embodiments, the correction circuitry may be located on one or both sides of a correction circuit that includes the correction circuit die.

At Block 410, the image is displayed. For example, the image corresponds to the signal read in from the read in circuitry. The image is displayed utilizing a display. For example, the display includes a display die. The display die may include a display driver (e.g., driver circuitry) on one or both sides of the display die. Alternatively, the display driver may be included on one or both sides of a display driver die. The image, for example, includes text, provides an image of a scene, and incorporates warning signals such as colors, flashes, etc., to signify biological or chemical threats. One of ordinary skill would understand that the content of the image is dictated by the overall system design and requirements.

Figure 5:
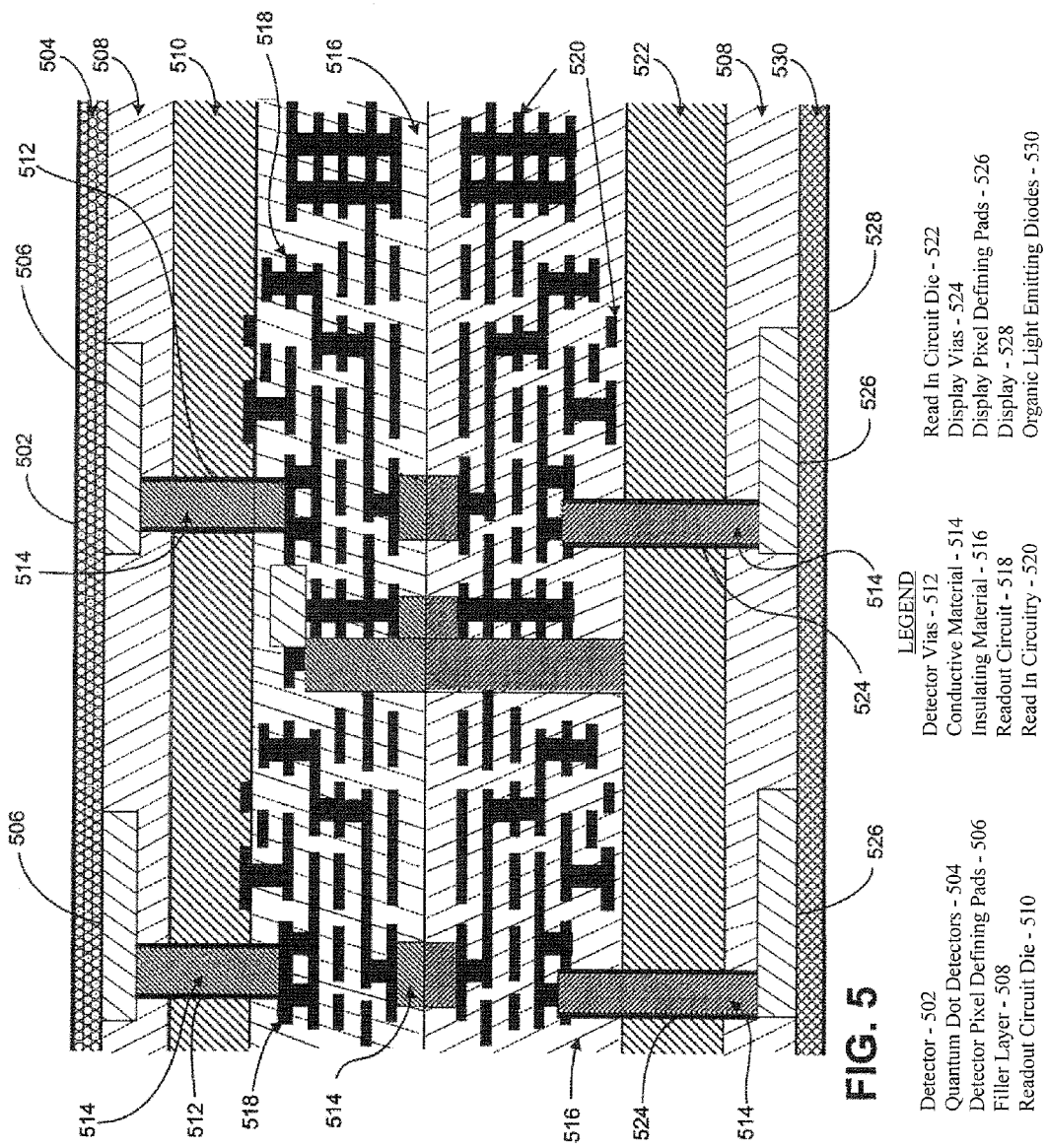
FIG. 5 is a schematic cross-sectional block diagram of an integrate detect and display system in accordance with another embodiment of the present invention.

FIG. 5 is a schematic cross-sectional block diagram of an integrate detect and display system in accordance with another embodiment of the present invention.

Referring to FIG. 5, an integrate detect and display system 500 includes a detector 502 having a plurality of quantum dot detectors 504, detector pixel defining pads 506, a filler layer 508, a readout circuit die 510, a plurality of detector vias 512, conductive material 514, insulating material 516, readout circuit portion 518, read in circuit portion 520, a read in circuit die 522, a plurality of display vias 524, display pixel defining pads 526, and a display 528 having a plurality of organic light emitting diodes 530. A border between a readout side and a read in side of the integrate detect and display system 500 is identified by opposing crosshatching at a line approximately mid-way between the quantum dot detectors 504 and the organic light emitting diodes 530.

The detector 502 is configured to receive radiation and convert the radiation into a signal. In this embodiment, the detector 502 has the plurality of quantum dot detectors 504 arranged as a focal plane array. For example, the quantum dot detectors have a 20-micron pitch and sense energy corresponding to wavelengths between about 300 nm and 1900 nm. One of ordinary skill in the art would recognize that system design considerations dictate the desired bandwidth of radiation and accordingly, the materials and components used for the detector 502.

The detector pixel defining pads 506 are configured to define a pixel region for each of the pixels of the detector 502. The detector pixel defining pads 506 are coupled to a portion of the plurality of quantum dot detectors 504. In an embodiment, portions of the quantum dot detectors 504 are etched away such that only the quantum dot detectors 504 coupled to the detector pixel defining pads 506 are present (e.g., portions between the detector pixel defining pads 506). In this embodiment, crosstalk between pixels may be reduced.

The filler material 508 fills in space between the detector pixel defining pads 506, the plurality of quantum dot detectors 504, the conductive material 514, and the readout circuit die 510 on the readout side (e.g., the detector side) of the integrate detect and display system 500. The filler material 508 also fills in space between the display pixel defining pads 526, the plurality of organic light emitting diodes 530, the conductive material 514, and the read in circuit die 522 on the read in side (e.g., the display side) of the integrate detect and display system 500.

The readout circuit die 510 is a block of semiconducting material (e.g., a semiconductor substrate, chip, wafer, etc.), on which CMOS circuitry and other active and/or passive components are fabricated. For example, the filler material 508 is a passive component. The readout circuitry 518 includes active components. The readout circuit die 510 my have active and/or passive components on one or both sides.

The plurality of detector vias 512 provides electrical connectivity for the plurality of quantum dot detectors 504 through the readout circuit die 510. Each of the plurality of detector vias 512 is a hole through the readout circuit die 510, and is filled with the conductive material 514 that provides electrical connectivity between a first side of the readout circuit die 510 and an opposing second side of the readout circuit die 510. For example, the conductive material 514 is indium. In other embodiments, the die have similar configurations that include a plurality of vias that are filled with conductive material.

The insulating material 516 fills in space between the readout circuit die 510, the conductive material 514, and the readout circuit portion 518, on the readout side of the integrate detect and display system 500. The insulating material 516 also fills in space between the read in circuit die 522, the conductive material 514, and the read in circuit portion 520, on the read in side of the integrate detect and display system 500.

The readout circuit portion 518 includes active components arranged to form an integrated circuit. In this embodiment, the readout circuit portion 518 reads out a signal from the detector 502 before transmitting the signal to the read in circuit portion 520. The readout circuit portion 518 is oriented behind and is substantially coextensive with the detector 502 and the readout circuit die 510.

The read in circuit portion 520 includes active components arranged to form an integrated circuit. In this embodiment, the read in circuit portion 520 receives data from the readout circuit portion 518 before reading in the data to the display 528. The read in circuit portion 520 is oriented behind and is substantially coextensive with the detector 502 and the readout circuit die 510. For example, the read in circuit portion 520 includes display driver circuitry configured to drive the display 528 in accordance with a signal.

The read in circuit die 522 is a block of semiconducting material (e.g., a semiconductor substrate, chip, wafer, etc.), on which CMOS circuitry and other active and/or passive components are fabricated. For example, the filler material 508 is a passive component. The read in circuit portion 520 includes active components. For example, the read in circuit die 522 has active and/or passive components on one or both sides.

The plurality of display vias 524 provides electrical connectivity for the plurality of organic light emitting diodes 530 through the read in circuit die 522. Each of the plurality of display vias 524 is a hole through the read in circuit die 522, and is filled with the conductive material 514 that provides electrical connectivity between a first side of the read in circuit die 522 and an opposing second side of the read in circuit die 522. For example, the conductive material 514 is indium.

The display pixel defining pads 526 are configured to define a pixel region for each of the pixels of the display 528. The display pixel defining pads 526 are coupled to a portion of the plurality of organic light emitting diodes 530. In an embodiment, portions of the organic light emitting diodes 530 are etched away such that only the organic light emitting diodes 530 coupled to the display pixel defining pads 526 are present (e.g., portions between the display pixel defining pads). In this embodiment, crosstalk between pixels may be reduced.

The display 528 receives signals from the read in circuit portion 520 through the plurality of display vias 524 and through the display pixel defining pads 526 to display an image. For example, the display 528 includes the plurality of organic light emitting diodes 530. However, in other embodiments, the display 528 includes a plurality of quantum dots or other suitable display devices.

Accordingly, there is presented an integrate detect and display system in accordance with embodiments of the present invention. In an exemplary embodiment, integration of a detector and a display is achieved, thereby rendering multiplexing and demultiplexing to and from off-chip processors unnecessary. Therefore, there is provided an integrate detect and display system in accordance with embodiments of the present invention with reduced weight, size, cost and power consumption.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An imaging system for receiving data from a scene and displaying an image therefrom, comprising:
   a detector comprising a plurality of detector pixels on a first side of the detector, readout circuitry on an opposing second side of the detector, and a plurality of detector vias configured to provide electrical connectivity for the plurality of detector pixels through the detector;
   a display comprising a plurality of display pixels on a first side of the display, read in circuitry on an opposing second side of the display, the read in circuitry coupled with the readout circuitry, and a plurality of display vias configured to provide electrical connectivity for the plurality of display pixels through the display; and
   wherein each of the detector pixels is in direct vertical integration with a corresponding one of the display pixels, and wherein the readout circuitry and the read in circuitry are located between and in substantially vertical alignment with the detector pixels and display pixels.

2. The imaging system of claim 1, further comprising:
   a correction circuit configured to control gain and offset and coupled between the detector and the display.

3. The imaging system of claim 1, further comprising:
   a display driver configured to drive a signal to be displayed and coupled between the detector and the display.

4. The imaging system of claim 1, further comprising:
   imaging optics configured to obtain data from the scene and optically process the data for detection by the detector.

5. The imaging system of claim 1, further comprising:
   a magnifier configured to magnify the displayed image.

6. The imaging system of claim 1, wherein each of the display pixels is arranged behind a corresponding one of the detector pixels.

7. The imaging system of claim 1, wherein the detector and the display each comprise an array of quantum dots.

8. The imaging system of claim 1, wherein the detector further comprises an organic biological threat indicator.

9. The imaging system of claim 1, wherein the detector further comprises an organic chemical threat indicator.

10. A method of detecting data from a scene and displaying an image therefrom, the method comprising:
    receiving the data from the scene utilizing a detector having a plurality of detector pixels and converting the data into a corresponding signal;
    reading out the signal from the detector utilizing readout circuitry oriented behind and substantially coextensive with the detector;
    reading in the signal from the readout circuitry to a display having a plurality of display pixels utilizing read in circuitry oriented behind and substantially coextensive with the readout circuitry; and
    displaying the image in accordance with the signal utilizing the display oriented behind and substantially coextensive with the read in circuitry, wherein each of the detector pixels is in direct vertical integration with a corresponding one of the display pixels, and wherein the readout circuitry and the read in circuitry are located between and in substantially vertical alignment with the detector pixels and display pixels.

11. The method of claim 10, further comprising:
    controlling gain and offset of the signal with correction circuitry oriented behind and substantially coextensive with the readout circuitry.

12. The method of claim 10, further comprising:
    driving the display in accordance with the signal utilizing display driver circuitry oriented behind and substantially coextensive with the readout circuitry.

13. The method of claim 10, wherein the display displays text.

14. The method of claim 10, wherein the detector and the display each comprise an array of organic light emitting diodes.

15. A vertically integrated stack of die configured to provide mechanical and electrical connectivity through each of the die therein, comprising:

a detector die comprising a plurality of detector pixels and a plurality of detector vias configured to provide electrical connectivity for the detector pixels through the detector die;

a display die comprising a plurality of display pixels on a first side of the display die, display driver circuitry on an opposing second side of the display die, and a plurality of display vias configured to provide electrical connectivity for the display pixels through the display die, wherein each of the detector pixels is in direct vertical integration with a corresponding one of the display pixels; and a readout circuit die coupled between and substantially coextensive with the detector die and the display die and comprising readout circuitry configured to read out detector data from the detector die and a plurality of readout vias configured to provide electrical connectivity for the readout circuitry through the readout circuit die, wherein the readout circuitry of the readout circuit die is coupled with the display driver circuitry of the display die, and wherein the readout circuitry and the read in circuitry are located between and in substantially vertical alignment with the detector pixels and display pixels.

16. The vertically integrated stack of die of claim 15, the readout circuit die further comprising read in circuitry configured to read in display data to the display driver circuitry.

17. The vertically integrated stack of die of claim 15, further comprising:

a correction circuit die configured to control gain and offset coupled between and substantially coextensive with the readout circuit die and the display die.

18. An imaging system for receiving data from a scene and displaying an image therefrom, comprising:

a readout circuit comprising a plurality of detector pixels on a first side of the readout circuit, readout circuitry on an opposing second side of the readout circuit, and a plurality of detector vias configured to provide electrical connectivity for the detector pixels through the readout circuit; and a read in circuit comprising a plurality of display pixels on a first side of the read in circuit, read in circuitry on an opposing second side of the read in circuit, and a plurality of display vias configured to provide electrical connectivity for the display pixels through the read in circuit, wherein the read in circuitry of the read in circuit is coupled with the readout circuitry of the readout circuit, and wherein each of the detector pixels is in direct vertical integration with a corresponding one of the display pixels, and wherein the readout circuitry and the read in circuitry are located between and in substantially vertical alignment with the detector pixels and display pixels.

19. The imaging system of claim 18, wherein the detector pixels are defined by a plurality of detector pixel defining pads, each of the detector pixel defining pads coupled with one of the detector vias, and the display pixels are defined by a plurality of display pixel defining pads, each of the display pixel defining pads coupled with one of the display vias.

\* \* \* \* \*